(12) United States Patent
Cyrusian

(10) Patent No.: US 8,575,968 B2
(45) Date of Patent: Nov. 5, 2013

(54) FAST POWER UP COMPARATOR

(75) Inventor: Sasan Cyrusian, Scotts Valley, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/323,654

(22) Filed: Dec. 12, 2011

(65) Prior Publication Data
US 2012/0146727 A1 Jun. 14, 2012

Related U.S. Application Data

(60) Provisional application No. 61/421,784, filed on Dec. 10, 2010.

(51) Int. Cl.
H03K 5/22 (2006.01)

(52) U.S. Cl.
USPC .............................. 327/65; 327/63; 327/108

(58) Field of Classification Search
USPC .................. 327/63, 65, 52, 89, 108, 142, 198
See application file for complete search history.

(56) References Cited

U.S. PATENT DOCUMENTS

| 5,289,051 | A | * | 2/1994 | Zitta | 327/108 |
| 7,936,180 | B2 | * | 5/2011 | Chao et al. | 326/30 |
| 8,063,696 | B2 | * | 11/2011 | Shinmyo | 327/563 |
| 2008/0024178 | A1 | * | 1/2008 | Kim et al. | 327/108 |
| 2011/0204926 | A1 | * | 8/2011 | Inoue | 327/89 |
| 2012/0126859 | A1 | * | 5/2012 | Kawamoto et al. | 327/108 |

* cited by examiner

Primary Examiner — Lincoln Donovan
Assistant Examiner — Jung H. Kim

(57) ABSTRACT

A circuit method includes periodically increasing a tail current of a differential stage of a comparator to periodically power on the differential stage to a power-on state, and periodically decreasing the tail current of the differential stage to periodically power down the differential stage to a low-power state. The periodically increasing of the tail current and the periodically decreasing of the tail current are asynchronous operations for powering on the differential stage to the power-on state and powering down the differential stage to the low-power state. Periodically increasing the tail current and the periodically decreasing the tail current asynchronously for powering on the differential stage to the power-on state and powering down the differential stage to the low-power state provide for low noise and high speed during signal comparison.

24 Claims, 4 Drawing Sheets

FAST POWER UP COMPARATOR

CROSS REFERENCE TO RELATED APPLICATIONS

This application claims the benefit of, and priority to, U.S. Provisional Patent App. No. 61/421,784, filed Dec. 10, 2010, titled "Fast Power Up Comparator," and is incorporated herein by reference in its entirety for all purposes.

FIELD OF USE

The present application relates generally to amplifiers, and more particularly relates to a comparator included in an amplifier and configured to be powered up and powered down by up-stream and down-stream control signals, respectively.

BACKGROUND

Unless otherwise indicated herein, the approaches described in the background section are not prior art to the claims in this application and are not admitted to be prior art by inclusion in the background section.

Audio amplifiers are well known and are used extensively to amplify audio signals. Designing an audio amplifier generally requires balancing two competing concerns. The first concern is fidelity, which relates to the accuracy with which the audio amplifier reproduces the sounds contained in the audio signal. The second concern is power efficiency, which relates to the power consumption of the audio amplifier under various operating conditions.

FIG. 1 is a block diagram of an amplifier 200, such as a class D amplifier. Amplifier 200 may be configured to amplify a set of analog signals for output of the amplified analog signals on a load 210 (i.e., a speaker). More specifically, amplifier 200 may include a signal generator 220 that may be configured to process received digital signals (Dinp, e.g., digital audio signals) and output first and second pulse width modulated (PWM) signals 225a and 225b having different pulse widths, which encode the digital signals. Signal generator 220 may be a Digital Signal Processor (DSP) and may include various circuits, such as a sigma-delta circuit with a subsequent pulse width modulator, for processing the received digital signal and generating the first and second Pulse Width Modulated (PWM) signals. First PWM signal 225a may be output on a positive output 230a and second PWM signal 225b may be output on a negative output 230b. An output stage 235 of the DSP may be configured to transfer either the first PWM signal 225a from positive output 230a onto an output 240 or the second PWM signal 225b from negative output 230b onto output 240. Positive and negative signals applied to switches 245a and 245b place either the first PWM signal or the second PWM signal onto output 240. A pull-up current source 250a may be coupled to positive output 230a and a pull-down current source 250b may be coupled to negative output 230b. Output 240 may be coupled to an input resistor 255 for converting the voltages of the first and second PWM signals to a PWM current signal (Ipwm).

Amplifier 200 includes an integrator 260, which may include a plurality of amplifiers, and is configured to integrate the difference between Ipwm the feedback current (Ifb) of a feedback signal. The result of the integration is provided by integrator 260 to a comparator 265.

The output of the comparator is provided to a one shot circuit 270, which controls an output stage 275 via a set of control signals. A feedback voltage is fed back from the output stage through a feedback resistor 280, which converts the feedback voltage to feedback current Ifb. As described above, the Ifb is fed back into integrator 260, which integrates the difference between currents Ipwm and Ifb. Integrator 260 is also configured to integrate the current accumulated by integration capacitor (Cint) 285, which integrates Ipwm.

For numerous applications of amplifier 200, the circuits to the amplifier operate at relatively high frequency and consume a relatively large amount power. For example, comparator 265 is a relatively high-frequency circuit that consumes a relatively large amount of power. In a variety of devices, such as handheld-mobile devices that use small rechargeable batteries, these relatively high power circuits of an amplifier can cause the charge stored on a battery to be consumed relatively quickly, which is generally not desirable.

Therefore, new amplifiers are needed that have relatively high-power efficiency, and new methods of operation of amplifiers are needed that provide for relatively reduced power consumption, for example, to extend the time a handheld-mobile device may operate between battery charges.

SUMMARY

The present application relates generally to amplifiers, and more particularly relates to a comparator included in an amplifier and configured to be powered up and powered down by up-stream and down-stream control signals, respectively.

According to one embodiment, a circuit method includes periodically increasing a tail current of a differential stage of a comparator to periodically power on the differential stage to a power-on state, and periodically decreasing the tail current of the differential stage to periodically power down the differential stage to a low-power state. The periodically increasing of the tail current and the periodically decreasing of the tail current are asynchronous operations for powering on the differential stage to the power-on state and powering down the differential stage to the low-power state.

According to a specific embodiment, the periodically increasing of the tail current and the periodically decreasing of the tail current asynchronously provide for low noise and high speed during signal comparison for powering on the differential stage to the power-on state and powering down the differential stage to the low-power state.

According to another specific embodiment, the circuit method further includes periodically increasing a head current of a second differential stage of the comparator coupled to the first mentioned differential stage to periodically power on the second differential stage to a power-on state, and periodically decreasing the head current of the second differential stage to power down the differential stage to a low-power state. The periodically increasing of the head current and the periodically decreasing of the head current are asynchronous operations for powering on the differential stage to the power-on state and powering down the differential stage to the low-power state.

According to another specific embodiment, the first differential stage is a negative stage of the comparator, and the second differential stage is a positive stage of the comparator.

According to another embodiment, a comparator includes a differential stage, which includes a first pull-down transistor having a first source-drain region, and a second pull-down transistor having second source-drain region, which is coupled to the first source-drain region. The comparator further includes a first current source coupled to the first and the second source-drain regions, and a second current source selectively coupled the first and the second source-drain regions. The comparator further includes a set of switches configured to provide the selective coupling of the second current source. The set of switches is configured to receive a set of upstream control signals for periodically closing the set of switches for powering on the differential stage. The set of switches are configured to receive a set of downstream control signals for periodically opening the set of switches for powering down the differential stage to a low-power state.

According to a specific embodiment, the comparator further includes a second differential stage, which includes a first pull-up transistor having a third source-drain region, and a second pull-up transistor having a fourth source-drain region, which is coupled to the third source-drain region. The comparator further includes a third current source coupled to the third and the fourth source-drain regions, and a fourth current source selectively coupled the third and the fourth source-drain regions. The comparator further includes a second set of switches configured to provide the selective coupling of the fourth current source. The second set of switches is configured to receive the set of upstream control signals for periodically closing the second set of switches for powering on the second differential stage. The second set of switches are configured to receive the set of downstream control signals for periodically opening the second set of switches for powering down the second differential stage to a low-power state.

According to another specific embodiment, the first mentioned differential stage is a negative differential stage, and the second differential stage is a positive differential stage.

According to another specific embodiment, the step of periodically powering on the first mentioned differential stage periodically increases a tail current for low noise and high speed of the comparator during signal comparison.

According to another specific embodiment, the step of periodically powering on the second mentioned differential stage periodically increases a tail current for low noise and high speed of the comparator during signal comparison.

According to another specific embodiment, the first pull-down transistor and the first pull-up transistor are a complimentary input stage. The second pull-down transistor and the second pull-up transistor are a complimentary reference stage.

According to another specific embodiment, the first and the second source-drain regions of the first pull-down and the second pull-down transistor are sources, and the third source-drain region and the fourth source-drain regions are sources.

According to another specific embodiment, a drain of the first pull-down transistor is coupled to a drain of the first pull-up transistor, and the drains of the first pull-down transistor and first pull-up transistor are a first output node.

According to another specific embodiment, a drain of the second pull-down transistor is coupled to a drain of the second pull-up transistor, and the drains of the second pull-down transistor and second pull-up transistor are a second output node.

According to another specific embodiment, the comparator further includes a first resistor and a second resistor disposed in series between the first output node and the second output node. A node between the first resistor and the second resistor is tied to a reference voltage.

According to another specific embodiment, an impedance and the first resistor and the second resistor is less than an impedance of the coupled drain regions of the first pull-up transistor and the first pull-down transistor, and is less than an impedance of the coupled drain regions of the second pull-up transistor and the second pull-down transistor.

According to another specific embodiment, the first resistor and the second resistor tied to the reference voltage inhibit instability in the comparator.

According to another specific embodiment, the first resistor is a transistor and the second resistor is another transistor.

According to another specific embodiment, the source of the first pull-down transistor is coupled to the source of the second pull-down transistor and the first current source, and the sources of the first and the second pull-down transistors are selectively coupled to the second current source.

According to another specific embodiment, the source of the first pull-up transistor is coupled to the source of the second pull-up transistor and the third current source, and the sources of the first and the second pull-up transistors are selectively coupled to the fourth current source.

According to another specific embodiment, the first and the third current sources are low-power current sources, and the second and the fourth current sources are high-power current sources configured to provide higher power than the low-power current sources.

According to another embodiment, a circuit includes a fully differential comparator having a positive output and a negative output, and an output stage coupled to the fully differential comparator and configured to combine the positive output and the negative output to a single output. The circuit further includes a first current source coupled to the fully differential comparator and the output stage, and a second current source selectively coupled the fully differential comparator and the output stage. The circuit further includes a third current source coupled a fully differential comparator and the output stage, and a fourth current source selectively coupled to the fully differential comparator and the output stage. The first and the third current sources are configured to power the fully differential comparator and the output stage in a low-power state. The second and the fourth current sources are configured to periodically power the fully differential comparator and the output stage in a power-on state.

According to a specific embodiment, the fully differential comparator includes a first differential stage and a second differential stage. The first differential stage and the second differential stage form a complimentary input stage including an first input configured to receive an input signal, and a complimentary reference stage including a second input configured to receive a reference voltage.

According to another specific embodiment, the output stage includes a first combiner stage configured to receive a positive input from the fully differential comparator, and a second combiner stage configured to receive a negative input from the fully differential comparator.

According to another specific embodiment, the first combiner stage is configured to be coupled to the first current source and selectively coupled to the second current source, and the second combiner stage is configured to be coupled to the second current source and selectively coupled to the fourth current source.

According to another specific embodiment, the first and the third current sources are low-power current sources, and the second and the fourth current sources are high-power current sources configured to provide higher power than the low-power current sources.

The following detailed description and accompanying drawings provide a more detailed understanding of the nature and advantages of the present invention.

DETAILED DESCRIPTION

Embodiments described in present application relate generally provide an amplifier, and more particularly provide a comparator included in an amplifier configured to be powered up and powered down by up-stream and down-stream control signals, respectively.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Amplifiers, such as audio amplifiers, are well known and are used extensively to amplify signals, such as audio signals. Designing an amplifier generally requires balancing two competing concerns. The first concern is fidelity, which relates to the accuracy with which the amplifier reproduces received signals (e.g., received audio signals). The second concern is power efficiency, which relates to the power consumption of the amplifier under various operating conditions. Amplifier embodiments described herein balance acceptable fidelity with acceptable power consumption, for example, for use in handheld portable devices, such as mobile phones, personal digital assistants, tablet computers, and the like.

Figure 1:
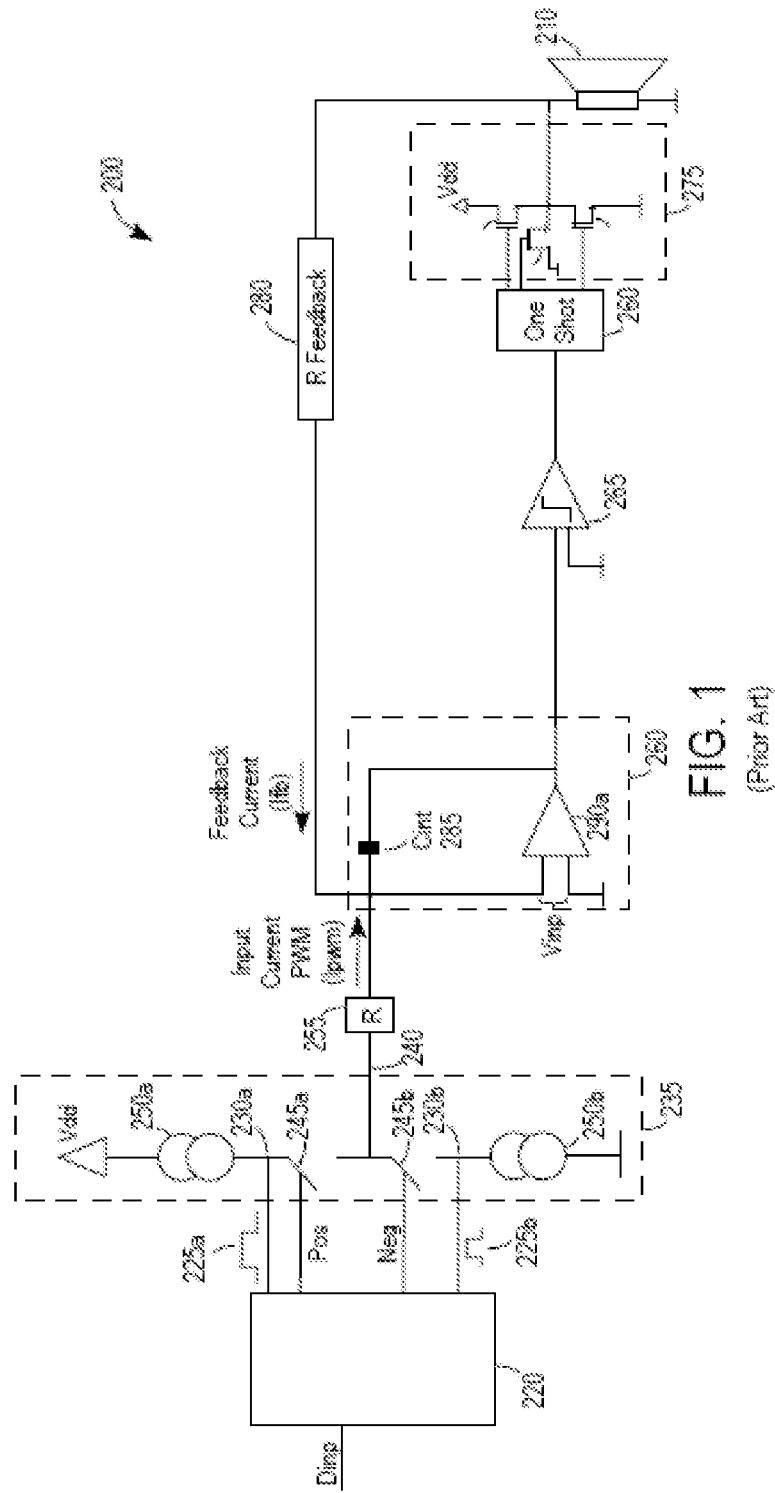
FIG. 1 is a block diagram of an amplifier, such as a class D amplifier.
Figure 2:
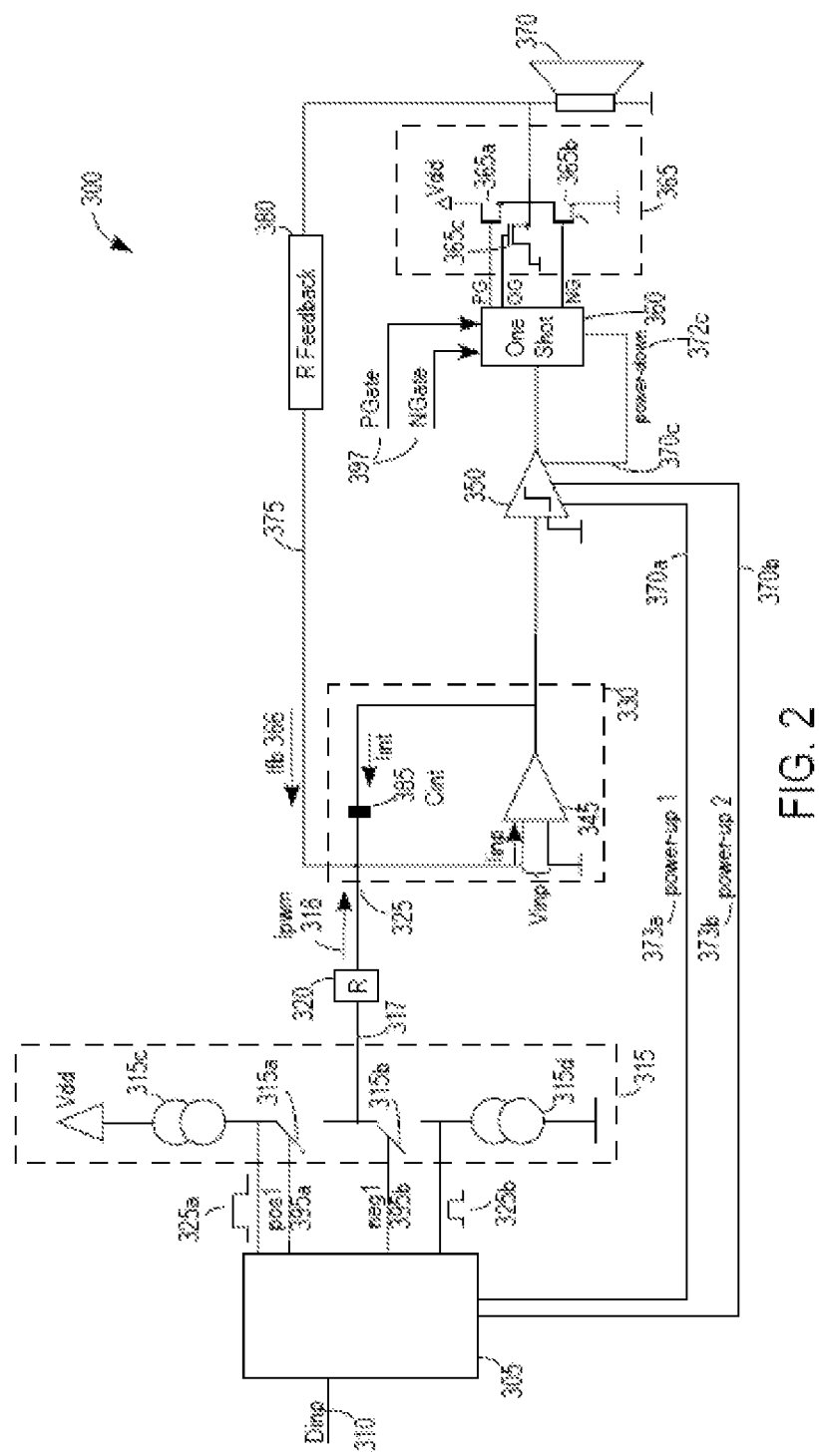
FIG. 2 is a simplified schematic of an amplifier according to one embodiment.

FIG. 2 is a simplified schematic of a digital amplifier 300 according to one embodiment. Digital amplifier 300 includes a signal generator 305, which is configured to receive a digital signal (Dinp) 310. Digital signal 310 may be a digital audio signal. Signal generator 305 may be a digital signal processor and may include a pulse width modulator and a subsequent sigma-delta circuit for processing digital signal 310. Signal generator 305 includes an output stage 315 coupled to an input resistor 320. Output stage 315 includes an output 317. According to some embodiments, input resistor 320 forms a portion of output stage 315 and signal generator 305. Input resistor 320 is coupled between output 317 of output stage 315 and an input 325 of an integrator 330. Integrator 330 may include an op-amp 345. A first input of op-amp 345 is coupled to the input 325 of integrator 330. Op-amp 345 includes a second input, which may be tied to a reference voltage, such as ground, −Vdd, etc.

An output of integrator 330 is coupled to a first input of a comparator 350. Comparator 350 includes a second input, which may be tied to a reference voltage, such as ground, −Vdd. An output of comparator 350 is coupled to an input of a one shot circuit 360. One shot circuit 360 is configured to control an output stage 365 of digital amplifier 300 where the output stage 365 is configured to transfer amplified signal (e.g., amplified audio signals) to a load 370 (e.g., a speaker). Output stage 365 may include a pull-up transistor 365a, a pull-down transistor 365b, and a tri-state transistor 365c, which are configured to generate a tri-level signal (high, low, and tri-state) based on respective control signals PG (positive gate), NG (negative gate), and OG (output gate) received from one shot circuit 360. The PG control signal may be configured to control the pull-up transistor, the OG control signal may be configured to control the tri-state transistor, and the NG signal may be configured to control the pull-down transistor.

According to one embodiment, digital amplifier 300 includes a first control path 370a from signal generator 305 to comparator 350, and a second control path 370b from the signal generator to comparator 350. The first and the second control paths 370a, 370b may be configured to transfer a first set of control signals from the signal generator to comparator 350. The first set of control signals may include a first power-on signal 373a (labeled "power-up 1" in FIG. 2) and a second power-on signal 373b (labeled "power-up 2" in FIG. 2). According to some embodiments, digital amplifier 300 may include a single control path (rather than two control paths) between the signal generator and comparator 350 that may be configured to transfer both the first power-on signal 373a and the second power-on signal 373b to comparator 350.

Digital amplifier 300 may further include a third control path 370c from one-shot circuit 360 to comparator 350. The third control path 370c is configured to transfer a second set of control signals to comparator 350. The second set of control signals may include a power-down signal 372c (labeled power-down in FIG. 2). The control signals transferred from the signal generator 305 and the one-shot circuit 360 to comparator 350 may be configured to control a power state of comparator 350. A power state may be a powered-off state, a low-power state, a powered-on state, etc. Control of the power state of comparator 350 is described in further detail below.

According to one embodiment, a feedback circuit path 375 feeds a feedback current from an output of output stage 365 to the first input of the first op-amp 345. Feedback circuit path 375 includes a feedback resistor 380 configured to convert a feedback voltage from output stage 365 to a feedback current (Ifb) 366. Integrator 330 further includes an integration capacitor (Cint) 385 configured to integrate a difference between an input current (Ipwm) 318 (described in further detail below) and feedback current 366.

As described briefly above, signal generator 305 is configured to receive digital signal 310 and perform processing on the digital signal to generate first and second pulse width modulated (PWM) signals 325a and 325b. The positive and negative signals 395a and 395b are generated by the signal generator and are configured to control whether the first or the second PWM signal is transferred to output 317 of output stage 315.

Output stage 315 may include switches 315a and 315b, which are controlled by the positive and negative signals applied to the switches to place either the first PWM signal 325a or the second PWM signal 325b onto output 317. A pull-up current source 315c may be coupled to switch 315a and a pull-down current source 315d may be coupled to switch 315b to couple either the pull-up current source or the pull-down current source to output 317.

The voltages of the first and the second PWM signals are converted to the PWM current signal Ipwm 318 by input resistor 320. Integrator 330 is configured to integrate the difference between Ipwm and Ifb onto Cint 385 as described briefly above.

According to one embodiment, subsequent to amplification of the first and second PWM signals (amplified PWM signals) by integrator 330, the amplified PWM signals are applied to the first input of comparator 350. The second input of comparator 350 is tied to a reference voltage Vref, which may be ground. If a voltage level of the amplified PWM signals applied to comparator 350 is greater than the reference voltage Vref, the output signal of comparator 350 is set to a high level, and if the voltage of the amplified PWM signals are less than the reference voltage Vref, the output signal of comparator 350 is set to a low level, which is less than the high level. Comparator 350 may be powered by supply voltage Vdd and −Vdd.

One shot circuit 360 is configured to receive the high level and the low level signals output by comparator 350 and may receive additional signals, such as timing signals from the signal generator for controlling the timing of asserting control signals PG, OG, and NG to output stage 365. As discussed briefly above, output stage 365 is configured to generate a tri-level signal based on the assertion of control signals PG, OG, and NG respectively on pull-up transistor 365a, tri-state transistor 365c, and pull-down transistor 365b. According to one embodiment, the output of output stage 365 is filtered by a filter to remove high frequencies from the output signal of output stage 365. Digital amplifier 300 may include a low-pass filter, a band-pass filter, or other filter configured to perform the described filtering. According to one embodiment, the load 370 (e.g., a speaker) includes the described filter and the output of output stage 365 may be applied directly to the load.

Control of the power states of comparator 350 is described in further detail immediately below. Comparator 350 may be a relatively high-power circuit configured for relatively high-frequency operation. To reduce power consumption of comparator 350, digital amplifier 300 is configured to power-on comparator 350 to put comparator 350 in a power-on state if comparator 350 is supposed to compare a signal received from integrator 330 with a reference voltage, and is further configured to power-down comparator 350 to put comparator 350 in a low-power state if comparator 350 is not supposed to be comparing a signal received from integrator 330 to the reference voltage. Alternatively, digital amplifier 300 may be configured to power-down comparator 350 to a powered-off state rather than a low-power state. More specifically, digital amplifier 300 may be configured to power-on comparator 350 a relatively short time before comparator 350 is supposed to make a comparison and power-down comparator 350 a relatively short time after comparator 350 has made a comparison.

In a low-power state comparator 350 is configured to draw a relatively small amount of current, and in a power-down state comparator 350 is configured not to draw current. In the low-power state comparator 350 may draw a relatively small amount of current to keep various circuits in comparator 350 powered-on where the various circuits that remain powered on may have a relatively long power-up time from a power-down state. In the low-power state comparator 350 is configured to draw considerably less current (e.g., 10% or less) than in the powered-on state as will be will understood by those of skill in the art.

According to one embodiment, signal generator 305 is configured apply the first power-up signal to comparator 350 to power-up comparator 350 if switch 315a is closed and the first PWM signal 325a is transferred to the output of output stage 315. The first power-up signal may be applied to comparator 350 by signal generator 305 so that comparator 350 has sufficient time to power-up from a low-power state or a power-down state so that comparator 350 can compare the first PWM single to the reference voltage after the first PWM signal is converted to a PWM current signal, integrated by integrator 330, and the amplified PWM signal is transferred to comparator 350. The first power-up signal may be a "copy" of the positive signal 395a applied to switch 315a and may be temporally retarded or temporally advanced, as needed, relative to positive signal 395a so that comparator 350 may sufficiently power-up for performing a comparison.

According to one embodiment, signal generator 305 is configured apply the second power-up signal to comparator 350 to power-up the comparator if switch 315b is closed and the second PWM signal 325b is transferred to the output of output stage 315. Similar to the first power-up signal, the second power-up signal may be applied to comparator 350 by signal generator 305 so that comparator 350 has sufficient time to power-up from a low-power state or a power-down state so that comparator 350 can compare the second PWM single to the reference voltage after the second PWM signal is converted to a PWM current signal, integrated by integrator 330, and the amplified PWM signal is transferred to comparator 350. The second power-up signal may be a "copy" of the negative signal 395b applied to switch 315b and may be temporally retarded or temporally advanced, as needed, relative to negative signal 395b so that comparator 350 may sufficiently power-up for performing a comparison.

The assertion of the first power-up signal and the positive signal by signal generator 305 may be based on a timing of the rising edges of the first PWM signal. Similarly, the assertion of the second power-up signal and the negative signal by signal generator 305 may be based on a timing of the rising edges of the second PWM signal. The first power-up signal, the second power-up signal, the positive signal, and the negative signal are each "upstream" signals and are generated and applied by signal generator 305 temporally before comparator 350 is configured to receive the upstream signals from signal generator 305 and operate on the upstream signal. As referred to herein, upstream signals are generated and/or processed in a processing stream by a circuit in the processing stream that process the upstream signals temporally before another circuit in the processing stream processes the upstream signals.

According to one embodiment, after comparator 350 has performed a comparison the first or the second PWM signal, digital amplifier 300 is configured to power-down comparator 350. According to one embodiment, the one-shot circuit is configured to apply power-down signal 372c to comparator 350 to power-down the comparator. The power-down signal may be applied to comparator 350 after the comparator has performed a comparison. According to one embodiment, the one-shot circuit is configured to receive a set of one-shot control signals 397 (e.g., labeled as Pgate and Ngate in FIG. 2) from signal generator 305 for controlling the temporal assertion and the temporal de-assertion of the PG, the OG, and the NG signals on the pull-up transistor, the tri-state transistor, and the pull-down transistor, respectively. According to one embodiment, the one-shot circuit is configured to generate the power-down signal based on one or more of the one-shot control signals received from signal generator 305. The power-down signal may be temporally retarded or temporally advanced, as needed, relative to one or more of the one-shot control signals so that comparator 350 may power-down relatively quickly after comparator 350 has performed a comparison. The power-down signal is a "downstream" signal and is generated and applied by the one-shot circuit temporally after comparator 350 is configured to perform a processing operation on a received signal (e.g., the amplified PWM signals) and temporally after comparator 350 receives the upstream signals from signal generator 305. As referred to herein, downstream signals are generated and/or processed in a processing stream by a circuit in the processing stream temporally after other circuits in the processing stream processes signals.

Figure 3:
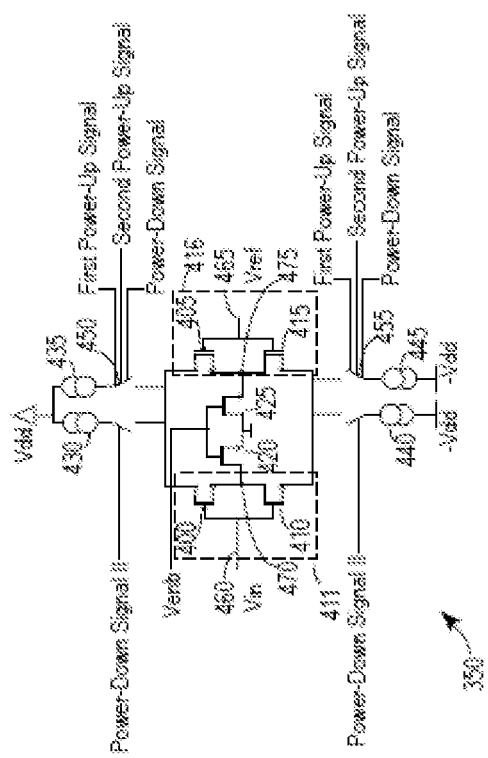
FIG. 3 is a simplified schematic of a comparator according to one embodiment.

FIG. 3 is a simplified schematic of comparator 350 (e.g., a fully differential comparator) according to one embodiment. Comparator 350 may include first and second pull-up transistors 400 and 405, respectively, which may be pMOSFETs, and may include first and second pull-down transistors 410 and 415, respectively, which may be nMOSFETs. The first and the second pull-up transistors 400 and 405 (pMOSFETs) are the positive differential stage portion of the comparator, and the first and the second pull-down transistors 410 and 415 are the negative differential stage of the comparator and form a fully differential comparator. Comparator 350 may further include first and second load transistors 420 and 425, which may also be MOSFETs. Comparator 350 may also include a low-power pull-up (LPPU) current source 430, a high-power pull-up (HPPU) current source 435, a low-power pull-down (LPPD) current source 440, and a high-power pull-down (HPPD) current source 445. LPPU current source 430 and HPPU current source 435 may be tied to Vdd (e.g., +1.8 volts). LPPD current source 440 and HPPD current source 445 may be tied to ground, −Vdd (e.g., −1.8 volts), etc. Comparator 350 further includes a first set of switches 450 and a second set of switches 455. While the first set of switches and the second set of switches is each generally shown as a single switch, it will be understood by those of skill in the art that the first and the second set of switches may be implemented via a variety switch designs, which may each include one or more transistors configured to perform the switching described herein.

Comparator 350 further includes a first input node 460 configured to receive the first and the second amplified PWM signals from integrator 330. First input node 460 is coupled to the gates of both the first pull-up transistors 400 and the first pull-down transistor 410. Comparator 350 also includes a second input node 465 configured to receive the reference voltage, e.g., Vref. The second input node is coupled to the gates of both the second pull-up transistors 405 and second pull-down transistor 415. Comparator 350 includes first and second output nodes 470 and 475.

According to one embodiment, first pull-up transistor 400 includes a first source-drain region (e.g., a source region) coupled to LPPU current source 430 and is switch coupled to the HPPU current source 435 via the set of switches 450. The first pull-up transistor 400 includes a second source drain region (e.g., a drain region) coupled to a first source-drain region (e.g., a drain region) of first pull-down transistor 410. A second source-drain region (e.g., a source region) of the first pull-down transistor is coupled to LPPD current source 440 and is switch coupled to the HPPD current source 445 via the set of switches 455. According to a further embodiment, the first source-drain region of first pull-up transistor 400 and the first source-drain region of second pull-up transistor 405 are also switched coupled to the LPPU current source 430 via a set of switches 451. According to another further embodiment, the second source-drain region of first pull-down transistor 410 and the source-drain region second pull-down transistor 415 are switched coupled to the LPPD current source 440 via a set of switches 456.

The first pull-up transistor 400 and the first pull down transistor 410 form a complimentary input stage 411. The complimentary input stage 411 provides that output node 470 is driven to an output state (either high or low) regardless of whether Vin 460 is high or low as. That is, the first pull-up transistor 400 (e.g., pMOS) and the first pull-down transistor 410 (e.g., nMOS) are complimentary and drive the output node to the output state for Vin 460 being high or low. Therefore, the output node may be driven to the output state relatively quickly as compared to a circuit in which the output node floats to a high state or a low state.

According to a further embodiment, the first source-drain region of the first pull-up transistor 400, which is coupled to the LPPU current source 430 and the HPPU current source 435, is a source region, and the second source-drain region of the first pull-down transistor 410, which is coupled to the LPPD current source 440 and the HPPD current source 445, is also a source region. Current supplied by the LPPU current source 430 and the HPPU current source 435 is referred to sometimes as the "head current." Current supplied by the LPPD current source 440 and the HPPD current source 445 is referred to sometimes as the "tail current." Coupling (also referred to as closing switches) the source regions of the first pull-up transistor 400 and the first pull-down transistor 410 to the current sources 430, 435, 440, and 445 provides that the first pull-up transistor 400 and the first pull-down transistor 410 switch relatively quickly compared to other configurations of the first pull-up transistor 400 and the first pull-down transistor 410.

The second pull-up transistor 405 and the second pull down transistor 415 form a complimentary reference stage 416. The complimentary reference stage 416 provides that output node 475 is driven to an output state (either high or low) so that the output state of output node 475 is relatively quickly driven to the output state.

According to a further embodiment, the first source-drain region of the second pull-up transistor 405, which is coupled to the LPPU current source 430 and the HPPU current source 435, is a source region, and the second source-drain region of the second pull-down transistor 415, which is coupled to the LPPD current source 440 and the HPPU current source 445, is also a source region. Coupling the source regions of the second pull-up transistor 405 and the second pull-down transistor 415 to the current sources 430, 435, 440, and 445 provides that the second pull-up transistor 405 and the second pull-down transistor 415 switch relatively quickly compared to other configurations of the second pull-up transistor 405 and the second pull-down transistor 415.

According to one embodiment, second pull-up transistor 405 includes a first source-drain region coupled to LPPU current source 430 and is switch coupled to the HPPU current source 435 via the set of switches 450. The first source-drain region of the second pull-up transistor is also coupled to the first source-drain region of the first pull-up transistor. The second pull-up transistor includes a second source drain region coupled to a first source-drain region of second pull-down transistor 415. A second source-drain region of the second pull-down transistor is coupled to LPPD current source 440 and is switch coupled to the HPPD current source 445 via the set of switches 455. The second source-drain region of the second pull-down transistor is also coupled to the second source-drain region of the first pull-down transistor.

The first output node 470 is coupled between the second source-drain region of the first pull-up transistor and the first source-drain region of the first pull-down transistor. The second output node 475 is coupled between the second source-drain region of the second pull-up transistor and the first source-drain region of the second pull-down transistor.

Gates of the first and second load transistors 420 and 425 are coupled to an enable input 480, which may be configured to receive an enable signal from integrator 330, a previous comparator stage, etc. A first source-drain region of the first load transistor is coupled to first output node 470, and a second source-drain region of the first load transistor is coupled to a first source drain region of the second load transistor 425 and to a reference voltage, e.g., ground, −Vdd, etc. A second source-drain region of the second load transistor is coupled to second output node 475.

According to one embodiment, the first and the second load transistors 420 and 425 provide a load impedance that is less than the output impedance at the output node 470 provided by the drain nodes of the first pull-up transistor 400 and the first pull-down transistor 410. The first and the second load transistors 420 and 425 may be considered series loads, or series resistors. The first and the second load transistors 420 and 425 also provide a load impedance that is less than the output impedance at the output node 475 provided by the drain nodes of the second pull-up transistor 405 and the second pull-down transistor 415. For example, the load impedance of the load transistors 420 and 425 may be approximately ten to twenty times less than the output impedance at the output node 470 provided by the drain regions of the first pull-up transistor 400 and the first pull-down transistor 410, and may be approximately ten to twenty times less than the output impedance at the output node 475 provided by the drain regions of the second pull-up transistor 405 and the second pull-down transistor 415. Providing the relatively low impedance of load transistors 420 and 425 to the reference voltage between load transistors 420 and 425 inhibits instability at the output stages 470 and 475 and therefore provides for relatively fast switching of the output states of the output nodes 470 and 475.

According to one embodiment, the first set of switches 450 is configured to receive the first power-up signal and the second power-up signal for coupling (also referred to herein as closing a switch) the HPPU current source 435 to the first source-drain regions of both the first and second pull-up transistors 400 and 405. More specifically, the first power-up signal and the second power-up signal may each be configured to independently couple the HPPU current source to the first source-drain regions of both the first and the second pull-up transistors 400 and 405. The first set of switches 450 may be configured to receive the power-down signal to decouple (also referred to herein as opening a switch) the HPPU current source from the first source-drain regions of both the first and second pull-up transistors 400 and 405. According to one embodiment, the first and the second power-up signals are applied asynchronously with respect to the power-down signal.

The second set of switches 455 is configured to receive the first power-up signal and the second power-up signal for coupling the HPPD current source 445 to the second source-drain regions of both the first and second pull-down transistors 410 and 415. More specifically, the first power-up signal and the second power-up signal may each be configured to independently couple the HPPD current source to the second source-drain regions of both the first and second the pull-down transistors 410 and 415. The second set of switches 455 may be configured to receive the power-down signal to decouple the HPPD current source from the second source-drain regions of both the first and second pull-down transistors 410 and 415.

With the HPPU current source coupled to the first source-drain regions of the first and second pull-up transistors 400 and 405, and with the HPPD current source coupled to the second source-drain regions of the first and second pull-down transistors 410 and 415, the comparator is configure to be in the powered-on state via current supplied by the four current sources HPPU, LPPU, HPPD, and LPPD. According to one embodiment, the HPPU current source is configured to provide a relatively higher amount of power to the comparator than the LPPU current source. For example, the HPPU current source may be configured to provide 90% more power to the comparator than the LPPU current source where the LPPU current source may provide 10% or less of the power to the comparator than the HPPU current source. Similarly, the HPPD current source is configured to provide a relatively higher amount of power (e.g., power from sinking current) to the comparator than the LPPD current source. For example, the HPPD current source may be configured to provide 90% more power to the comparator than the LPPD current source where the LPPU current source may provide 10% or less of the power to the comparator than the HPPD current source.

As briefly described above, the power-down signal is configured to control the first and the second set of switches to decouple the HPPU current source from the first and second pull-up transistors, and decoupled the HPPD current source from the first and second pull-down transistors. With the HPPU current source and the HPPD current source decoupled from their associated transistors, the comparator is placed in the lower-power state with the LPPU current source and the LPPD current source configured to power the comparator in the low-power state. The LPPU current source and the LPPD current source are configured to provide sufficient power to maintain a potential bias on various circuits of the comparator so that the comparator may be powered on relatively quickly to the power-on state.

According to one embodiment, the sets of switches 451 and 456 may be configured to receive a second power-down signal (power-down signal II) for coupling (also referred to as closing switches) and decoupling (also referred to as opening switches) the LPPU current source 430 and the LPPD current source 440. In the de-coupled mode of the HPPU current source 435, the HPPD current source 445, the LPPU current source 430, and the LPPD current source 440, comparator 350 may be placed in a power-down state where the comparator does not draw current from the HPPU current source 435, the HPPD current source 445, the LPPU current source 430, and the LPPD current source 440.

According to one embodiment, i) providing for the LPPU current source 430 and the HPPU current source 435 to be coupled to the source regions of the first and the second pull-up transistors 400 and 405, ii) providing for the LPPD current source 440 and the HPPD current source 445 to be coupled to the source regions of the first and the second pull-down transistors 410 and 415, iii) providing for a complimentary input stage, iv) providing for a complimentary reference stage, and v) providing for the load transistors to a reference voltage, comparator 350 may be configured to power on relatively quickly, and switch the output state of the output nodes 470 and 475 relatively quickly. For example, the comparator may operate at approximately 500 kilohertz or more, where the comparator may be in the power-on state for approximately 50 nanoseconds and in the low-power state for the remainder of the duty cycle. Embodiments of the comparator described herein provide relatively large improvements in switching speeds compared to traditional comparators.

Figure 4:
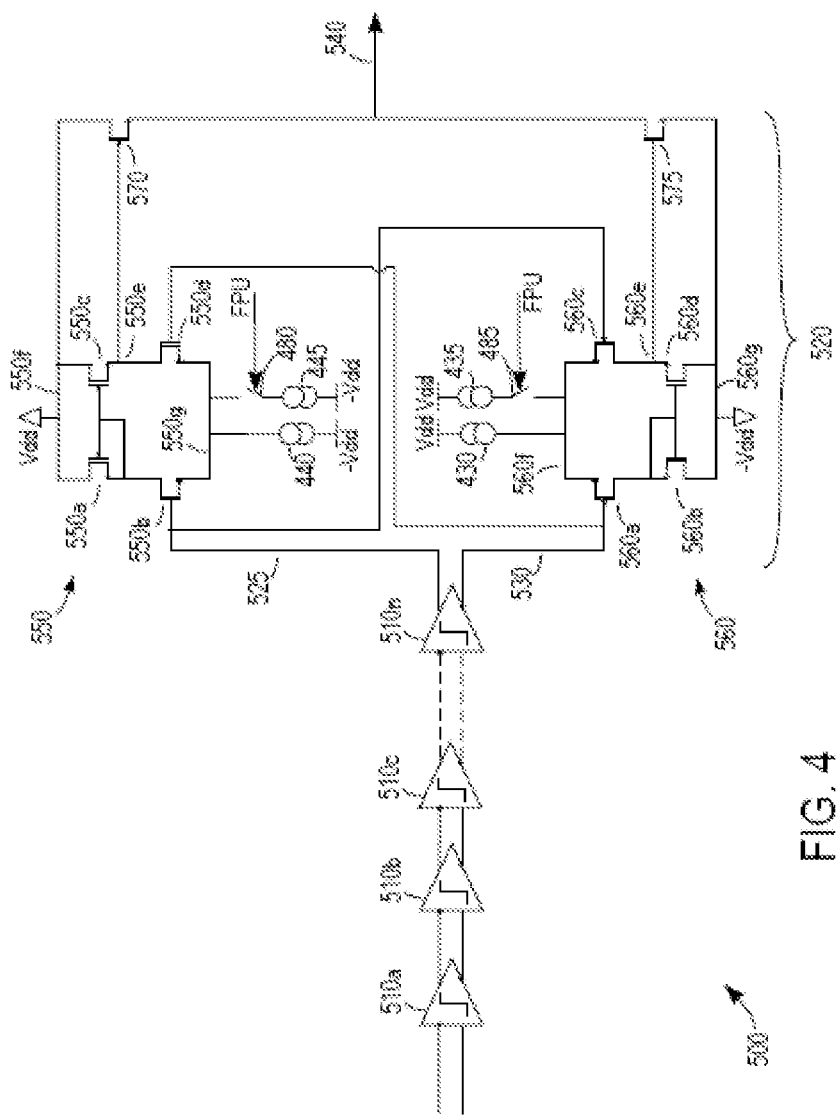
FIG. 4 is a simplified schematic of a comparator circuit according to one embodiment.

FIG. 4 is a simplified schematic of a comparator circuit 500 according to one embodiment. Comparator circuit 500 includes a plurality of comparators 510 where each comparator is labeled with the base reference number 510 and an alphabetic suffix (a, b, c . . . n). Each comparator 510a to 510n may include a comparator 350 described above and shown in FIG. 3. Each comparator 510a to 510n may be a fully differential comparator (e.g., comparator 350) for receiving a positive input and a negative input, and for outputting a positive output and a negative output. According to one embodiment, each comparator 510a to 510n has a relatively small gain, e.g., a gain of about 3-5, and therefore has a relatively fast switching speed compared to comparators having a higher gain. By providing a series of comparators 510a . . . 510n with relatively low gain, the series of comparators may provide relatively fast switching for a relatively high gain as compared to a single traditional comparators providing the relatively high gain.

According to one embodiment, comparator circuit 500 includes an output stage 520 where output stage 520 includes a positive input 525, which is configured to receive a positive input from comparator 510*n*, and includes a negative input 530, which is configured to receive a negative input from comparator 510*n*. Output stage 520 is configured to combine a positive input received at positive input 525 and a negative input received at negative input 530 onto a single output 540. Output stage 520 may be configured to provide rail-to-rail drive to output 540 for comparators 510*a* . . . 510*n*. Output stage 520 includes a first combiner stage 550 for pulling a high output signal to the high rail (e.g., +Vdd) and includes a second combiner stage 560 for pulling a low output signal to the low rail (e.g., −Vdd). First combiner stage 550 may be a first current mirror, and second combiner stage 565 may be a second current mirror. For convenience, the first combiner stage 550 is referred to as the first current mirror 550, and the second combiner stage 560 is referred to as the first current mirror 560.

The first current mirror 550 includes a first pull-up transistor 550*a*, a first pull-down transistor 550*b*, a second pull-up transistor 550*c*, and a second pull-down transistors 550*d* where the first pull-up transistor 550*a* and the first pull-down transistor 550*b* are a first branch of the first current mirror 550, and the second pull-up transistor 550*c* and the second pull-down transistors 550*d* are a second branch of the first current mirror 550.

The second current mirror 560 includes a first pull-up transistor 560*a*, a first pull-down transistor 560*b*, a second pull-up transistor 560*c*, and a second pull-down transistors 560*d* where the first pull-up transistor 560*a* and the first pull-down transistor 560*b* are a first branch of the first current mirror 560, and the second pull-up transistor 560*c* and the second pull-down transistors 560*d* are a second branch of the first current mirror 560.

Positive input 525 may be coupled to the gate of first pull-down transistor 550*b* of first current mirror 550 and the gate of second pull-up transistor 560*d* of second current mirror 560. Negative input 530 may be coupled to the gate of the first pull-up transistor 560*a* of first current mirror 550 and the gate of second pull-down transistor 550*d* of second current mirror 560.

An output node 550*e* of the first current mirror 550 is coupled to a gate of a pull-up output transistor 570, which is configured to pull up the single output 540 to +Vdd (minus a diode drop) if a positive output is asserted to the output stage 520 by comparator 510*n*. An output node 560*e* of the second current mirror 560 is coupled to a gate of a pull-down output transistor 575, which is configured to pull down the single output 540 to −Vdd (minus a diode drop) if a negative output is asserted to the output stage 520 by comparator 510*n*.

A "top" 550*f* of the first current mirror 550 may be tied to Vdd, and a "bottom" 550*g* of the first current mirror 550 may be tied to the LPPD current source 440 and the HPPD current source 445. According to one embodiment, the bottom 550*g* of the first current mirror 550 is switch coupled via a switch 480 to the HPPD current source 445. Switch 580 may be configured to receive the first power-up signal, the second power-up signal, and the power-down signal for powering up the first current mirror 550 to the power-on state and powering down the first current mirror 550 to the low-power state. The first power-up signal, the second power-up signal, and the power-down signal are generally labeled FPU (fast power up) in FIG. 4.

A "top" 560*f* of the second current mirror 560 may be tied to the LPPD current source 430 and the HPPD current source 435 and a "bottom" 560*g* of the second current mirror 560 may be tied to −V-dd. According to a further embodiment, the top 560*f* of the second current mirror 560 is switch coupled via a switch 485 to the HPPD current source 435. Switch 485 may be configured to receive the first power-up signal, the second power-up signal, and the power down signal for powering up the second current mirror 560 to the power-on state and powering down the second current mirror 560 to the low-power state. Providing that the bottom 550*g* of the first current mirror 550 and the top 560*f* of the second current mirror 560 are tied to the LPPD current sources 430, 440 and are switch coupled to the HPPD current sources 435, 445 further provides that output stage 520 may be placed in the power-on state and the low-power state substantially synchronously with the comparators 510*a* . . . 510*n* to conserve power, and may be switched from the low-power state to the power-on state relatively quickly because the first and the second current mirrors 550 and 560 are biased by the LPPU current source 430 and the LPPD current source 440 for relatively fast power up.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, it will be understood that while various embodiments are described herein as including MOSFETs, it will be understood that various transistor types may be used in implement the logic and operation of the circuits described herein. Based on the above disclosure and the following claims, other arrangements, embodiments, implementations, and equivalents may be employed without departing from the scope of the invention as defined by the claims.

What is claimed is:

1. A circuit comprising:
   a differential comparator having a positive output and a negative output;
   an output stage connected to the differential comparator, the output stage configured to (i) receive the positive output and the negative output at control electrodes of transistors of the output stage and, (ii) provide a single output in response to the positive output and the negative output;
   a first current source connected to the differential comparator and the output stage;
   a second current source selectively connected to the differential comparator and the output stage;
   a third current source connected to the differential comparator and the output stage; and
   a fourth current source selectively connected to the differential comparator and the output stage,
   wherein
   the first current source and the third current source are configured to supply power to (i) the differential comparator while the differential comparator is in a low-power state, and (ii) the output stage while the output stage is in a low-power state, and
   the second current source and the fourth current source are configured to periodically supply power (i) to transition the differential comparator from the low-power state of the differential comparator to a power-on state, and (ii) to transition the output stage from the low-power state of the output stage to a power-on state.

2. The circuit of claim 1, wherein the differential comparator includes a first differential stage and a second differential stage.

3. The circuit of claim 1, wherein the differential comparator comprises:
   an input stage including a first input, wherein the first input of the input stage is configured to receive an input signal; and
   a reference stage including a second input, wherein the second input of the reference stage is configured to receive a reference voltage.

4. The circuit of claim 3, wherein the output stage includes:
   a first stage configured to receive a positive input from the differential comparator; and
   a second stage configured to receive a negative input from the differential comparator.

5. The circuit of claim 4, wherein:
   the first stage of the output stage is configured to be (i) connected to the first current source, and (ii) selectively connected to the second current source; and
   the second stage of the output stage is configured to be (i) connected to the second current source, and (ii) selectively connected to the fourth current source.

6. The circuit of claim 1, wherein the second current source and the fourth current source are configured to provide more power than the first current source and the third current source.

7. The circuit of claim 1, wherein the differential comparator comprises:
   a first differential stage including
      a first pull-down transistor having a first source-drain region, and
      a second pull-down transistor having second source-drain region, wherein the second source-drain region is connected to the first source-drain region,
      wherein the first current source is connected to the first source-drain region and the second source-drain region, and
      wherein the second current source is selectively connected to the first source-drain region and the second source-drain region; and
   a first set of switches configured to provide the selective connecting of the second current source to the first source-drain region and the second source-drain region, wherein the first set of switches is configured to receive
      a set of first control signals to periodically close the first set of switches and power on the first differential stage, and
      a set of second control signals to periodically open the first set of switches and power down the first differential stage to a low-power state.

8. A circuit comprising:
   a differential comparator having a positive output and a negative output;
   an output stage connected to the differential comparator, the output stage configured to provide a single output based on the positive output and the negative output;
   a first current source connected to the differential comparator and the output stage;
   a second current source selectively connected to the differential comparator and the output stage;
   a third current source connected to the differential comparator and the output stage; and
   a fourth current source selectively connected to the differential comparator and the output stage,
   wherein
      the first current source and the third current source are configured to supply power to (i) the differential comparator while the differential comparator is in a low-power state, and (ii) the output stage while the output stage is in a low-power state, and
      the second current source and the fourth current source are configured to periodically supply power (i) to transition the differential comparator from the low-power state of the differential comparator to a power-on state, and (ii) to transition the output stage from the low-power state of the output stage to a power-on state,
   wherein the differential comparator comprises
      a first differential stage including
         a first pull-down transistor having a first source-drain region, and
         a second pull-down transistor having second source-drain region, wherein the second source-drain region is connected to the first source-drain region,
         wherein the first current source is connected to the first source-drain region and the second source-drain region, and
         wherein the second current source is selectively connected to the first source-drain region and the second source-drain region, and
      a first set of switches configured to provide the selective connecting of the second current source to the first source-drain region and the second source-drain region, wherein the first set of switches is configured to receive
         a set of first control signals to periodically close the first set of switches and power on the first differential stage, and
         a set of second control signals to periodically open the first set of switches and power down the first differential stage to a low-power state,
      a second differential stage including
         a first pull-up transistor having a third source-drain region, and
         a second pull-up transistor having a fourth source-drain region, wherein the fourth source-drain region is connected to the third source-drain region,
         wherein the third current source is connected to the third source-drain region and the fourth source-drain region,
         wherein the fourth current source is selectively connected to the third source-drain region and the fourth source-drain region, and
   a second set of switches configured to provide the selective connecting of the fourth current source to the third source-drain region and the fourth source-drain region, and
   wherein the second set of switches is configured to receive
      the set of first control signals to periodically close the second set of switches and power on the second differential stage, and
      the set of second control signals to periodically open the second set of switches and power down the second differential stage to a low-power state.

9. The circuit of claim 8, wherein:
the first differential stage is a negative differential stage; and
the second differential stage is a positive differential stage.

10. The circuit of claim 8, wherein:
the first differential stage receives an input signal and a reference signal; and periodically closing the first set of switches to power on the first differential stage includes periodically increasing a tail current of the first differential stage while the comparator compares the input signal to the reference signal.

11. The circuit of claim 10, wherein periodically closing the second set of switches to power on the second differential stage includes periodically increasing a tail current of the second differential stage while the comparator compares the input signal to the reference signal.

12. The circuit of claim 8, wherein an input stage of the comparator comprises the first pull-down transistor and the first pull-up transistor.

13. The circuit of claim 12, wherein a reference stage of the comparator comprises the second pull-down transistor and the second pull-up transistor.

14. The circuit of claim 12, wherein:
the first source-drain region of the first pull-down transistor and the second source-drain region of the second pull-down transistor are sources; and
the third source-drain region of the first pull-up transistor and the fourth source-drain region of the second pull-up transistor are sources.

15. The circuit of claim 14, wherein:
the source of the first pull-down transistor is connected to (i) the source of the second pull-down transistor, and (ii) the first current source; and
the source of the first pull-down transistor and the source of the second pull-down transistor are selectively connected to the second current source.

16. The circuit of claim 15, wherein:
the source of the first pull-up transistor is connected to (i) the source of the second pull-up transistor, and (ii) the third current source; and
the source of the first pull-up transistor and the source of the second pull-up transistor are selectively connected to the fourth current source.

17. The circuit of claim 14, wherein:
a drain of the first pull-down transistor is connected to a drain of the first pull-up transistor; and
a first output node of the comparator comprises the drain of the first pull-down transistor and the drain of the first pull-up transistor.

18. The circuit of claim 17, wherein:
a drain of the second pull-down transistor is connected to a drain of the second pull-up transistor; and
a second output node of the comparator comprises the drain of the second pull-down transistor and the drain of the second pull-up transistor.

19. The circuit of claim 18, further comprising a first resistance and a second resistance disposed in series between the first output node and the second output node,
wherein a node between the first resistance and the second resistance receives a reference voltage.

20. The circuit of claim 19, wherein a combined impedance of the first resistance and the second resistance is less than:
a combined impedance of (i) the drain region of the first pull-up transistor, and (ii) the drain region of the first pull-down transistor; and
a combined impedance of (i) the drain region of the second pull-up transistor, and (ii) the drain region of the second pull-down transistor.

21. The circuit of claim 19, wherein the first resistance and the second resistance inhibit instability in the comparator.

22. The circuit of claim 2, wherein the second current source and the fourth current source are configured to provide more power than the first current source and the third current source.

23. The circuit of claim 1, wherein the first current source and the third current source are configured to supply power to an input of the output stage.

24. The circuit of claim 1, wherein each of the first current source and the second current source is configured to supply current to each of the comparator and the output stage.

* * * * *